United States Patent
Yen et al.

(10) Patent No.: US 9,224,911 B2
(45) Date of Patent: Dec. 29, 2015

(54) METHOD FOR SEPARATING LIGHT-EMITTING DIODE FROM A SUBSTRATE

(75) Inventors: Wei-Yu Yen, Taichung (TW); Fu-Bang Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 36 days.

(21) Appl. No.: 13/611,951

(22) Filed: Sep. 12, 2012

(65) Prior Publication Data

US 2014/0073075 A1    Mar. 13, 2014

(51) Int. Cl.
*H01L 33/48* (2010.01)
*H01L 33/00* (2010.01)

(52) U.S. Cl.
CPC .................................. *H01L 33/0079* (2013.01)

(58) Field of Classification Search
CPC .................................................. H01L 33/0079
See application file for complete search history.

(56) References Cited

U.S. PATENT DOCUMENTS

| | | | |
|---|---|---|---|
| 2002/0017653 A1* | 2/2002 | Chuang | 257/103 |
| 2004/0157354 A1* | 8/2004 | Kuriyama et al. | 438/45 |
| 2008/0202582 A1* | 8/2008 | Noda | C30B 25/02 136/261 |
| 2010/0015782 A1* | 1/2010 | Yu et al. | 438/463 |
| 2010/0065820 A1* | 3/2010 | Tombler, Jr. | 257/24 |
| 2010/0323506 A1* | 12/2010 | Cheng et al. | 438/507 |
| 2013/0095640 A1* | 4/2013 | Zhang | 438/478 |
| 2013/0256722 A1* | 10/2013 | Yang et al. | 257/98 |

* cited by examiner

*Primary Examiner* — Stanetta Isaac
(74) *Attorney, Agent, or Firm* — Muncy, Geissler, Olds & Lowe, P.C.

(57) ABSTRACT

A method for separating a light-emitting diode (LED) from a substrate comprises the following steps. First, a substrate is provided which includes a junction surface and a bottom surface far away from the junction surface. Then a plurality holes are formed on the junction surface. An LED structure is further grown on the junction surface, and includes a junction portion bonded to the junction surface. The bottom surface is then polished to be shrunk to communicate with the holes. Finally, the junction portion is etched by an etching liquid via the holes to separate the LED structure from the substrate. Accordingly, by forming the holes, the LED structure and the substrate can be separated through polishing and etching processes, thereby providing a high yield rate as well as reduced production costs.

8 Claims, 11 Drawing Sheets

Fig. 1A

PRIOR ART

Fig. 1B

PRIOR ART

METHOD FOR SEPARATING LIGHT-EMITTING DIODE FROM A SUBSTRATE

FIELD OF THE INVENTION

The present invention relates to a method for manufacturing a light-emitting diode (LED), and particularly to a method for separating an LED from a substrate.

BACKGROUND OF THE INVENTION

A light-emitting diode (LED) is principally formed by a multiple epitaxy structure of a light-emitting semiconductor material. For example, a blue LED is chiefly formed by a gallium nitride based (GaN-based) epitaxy film, which is internally a PN structure with one-directional electrical conductivity.

The above-mentioned blue LED usually adopts a sapphire substrate to grow a high-quality GaN-based epitaxy film thereon; however, a sapphire substrate has poor thermal and electrical conductivities. Therefore, conventional blue LED can only adopt a lateral structure having positive and negative electrodes located at a same side of the substrate. Thus, a light-emitting area of the LED element is decreased, and the resistance and forward voltage drop are increased due to a current crowding effect.

Figure 1A:
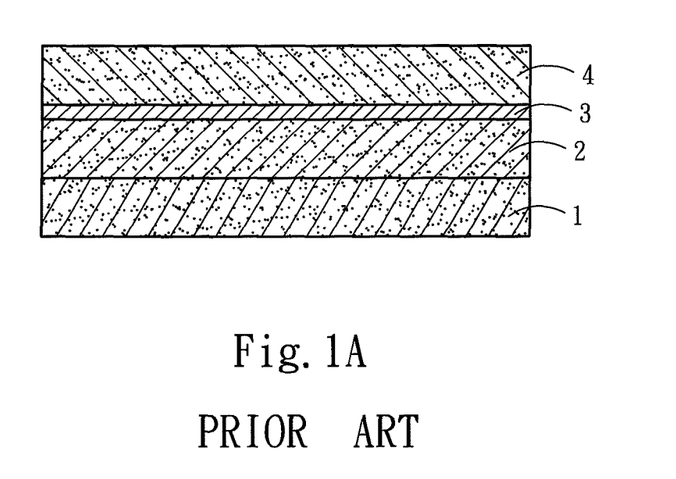
FIG. 1A is a schematic diagram of a conventional LED element before removing a sapphire substrate.
Figure 1B:
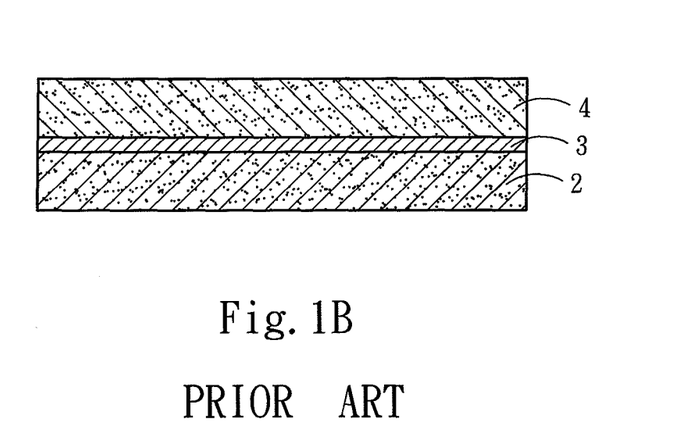
FIG. 1B is a schematic diagram of a conventional LED element after removing a sapphire substrate.

Please refer to FIGS. 1A and 1B for the schematic diagrams of a conventional LED element before and removing a sapphire substrate respectively. To improve the foregoing defects, a method used nowadays for manufacturing a high-performance LED element is to first grow a GaN-based epitaxy film 2 on a sapphire substrate 1. A binding layer 3 is then grown on the epitaxy film 2, and a new substrate 4 is formed on the binding layer 3. By laser lift-off or chemical mechanical polishing, the sapphire substrate 1 is further removed to allow the GaN-based epitaxy film 2 to remain on the new substrate 4. The new substrate 4 has a high heat dissipation coefficient and good electricity conductivity and is therefore more adaptable to high driving current applications, thereby solving issues such as heat dissipation under a high lumen flux of an LED element.

However, in the above-mentioned method of removing the sapphire substrate, the laser lift-off process is costly and produces stress which is difficult to control and may cause fragmentation. Moreover, the chemical mechanical polishing process may cause problems such as low polishing accuracy, difficulty in controlling a polishing range, and over-polishing or under-polishing.

SUMMARY OF THE INVENTION

Therefore the primary object of the present invention is to solve the issues of high costs and difficulty in control of a conventional method for separating an LED element from a substrate.

To achieve the above object, the invention provides a method for separating an LED from a substrate. The method includes:

Step S1: providing a substrate, the substrate including a junction surface and a bottom surface far away from the junction surface.

Step S2: forming a plurality of holes on the junction surface.

Step S3: growing an LED structure on the junction surface the LED structure including a junction portion bonded to the junction surface.

Step S4: polishing the bottom surface to make the bottom surface to be shrunk to communicate with the holes.

Step S5: etching the junction portion by an etching liquid through the holes to separate the LED structure from the substrate.

Accordingly, by forming the holes and polishing the bottom surface to communicate with the holes, the junction portion can be etched by the etching liquid through the holes to separate the LED structure from the substrate. Thus it is easy to control the polishing process to provide a high yield rate as well as reduced production costs.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 2:
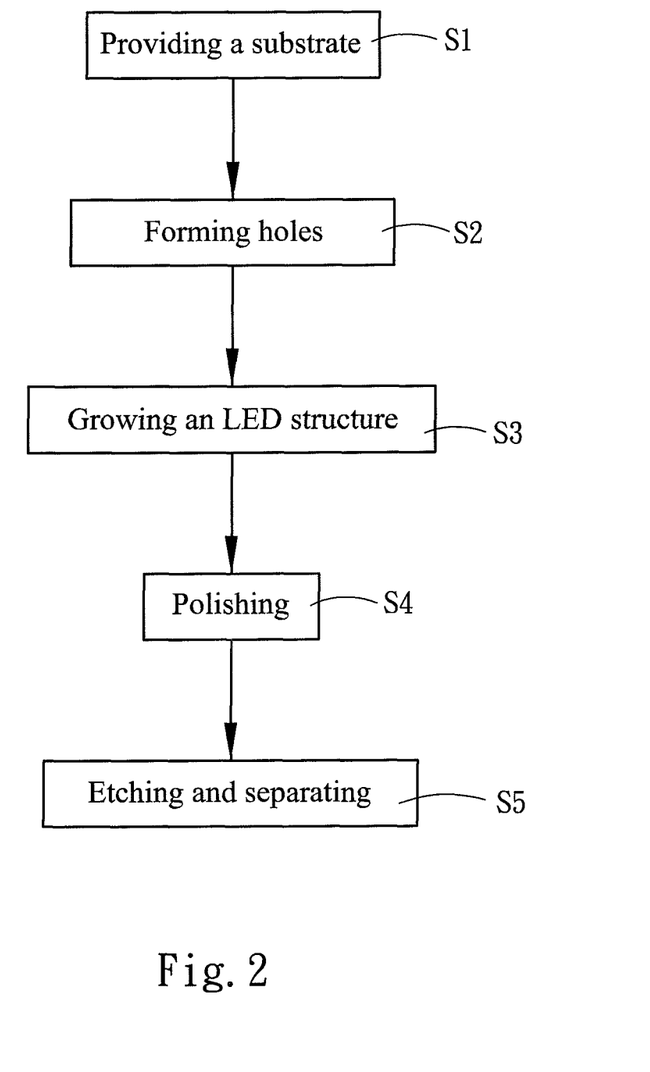
FIG. 2 is a flowchart showing the steps of a method for separating an LED structure from a substrate according to a first embodiment of the present invention.

Please refer to FIG. 2 for a flowchart showing the steps of a method for separating an LED from a growth substrate according to first embodiment of the present invention and to FIGS. 3A to 3D for schematic diagrams of the manufacturing processes of a method for separating an LED from a growth substrate according to the first embodiment. The method for separating an LED from a substrate 10 includes the following steps.

Figure 3A:
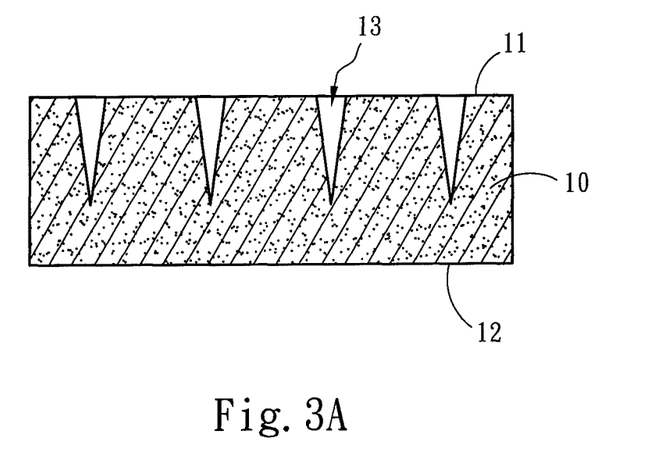
FIG. 3A to 3D are schematic diagrams of the manufacturing processes of a method for separating an LED structure from a growth substrate according to the first embodiment of the present invention.

Referring to FIG. 3A, in Step S1 and Step S2, a substrate 10 is first provided. The substrate 10 includes a junction surface 11 and a bottom surface 12 far away from the junction surface. A plurality of holes 13 are then formed on the junction surface by etching. In this embodiment, the substrate 10 is a sapphire substrate. The holes 13 are formed at a height between 10 and 50 µm and a width between 2 and 6 µm. The width of the holes 13 gradually decreases from the junction surface 11 towards the bottom surface 12 because of etching while the holes 13 do not penetrating the substrate 10.

Figure 3B:
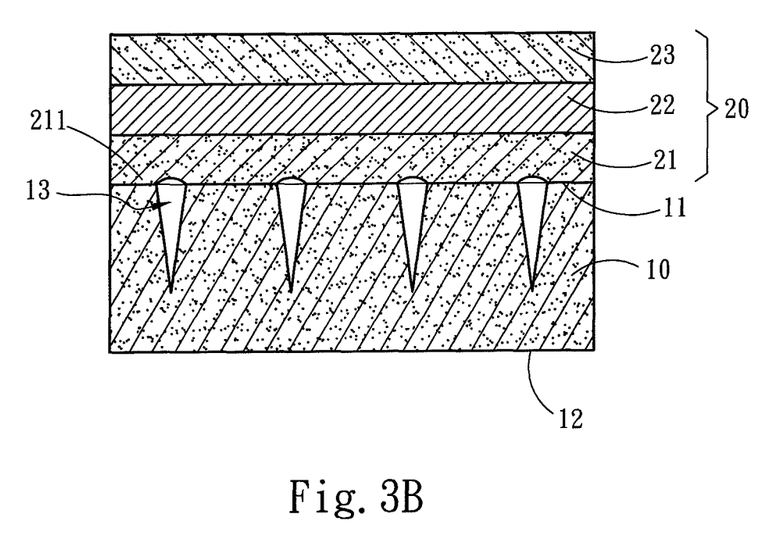

Referring to FIG. 3B, in Step S3, an LED structure 20 is grown on the junction surface 11, and a junction portion 211 on the LED structure 20 bonds to the junction surface 11. In this embodiment, the LED structure 20 includes a light-emitting epitaxy layer 21, an intermediate layer 22 bonded to the light-emitting epitaxy layer 21, and a support substrate 23 bonded to the intermediate layer 22. In this embodiment, the light-emitting epitaxy layer 21 is made of gallium nitride as example while it can also be made of a gallium nitride based material such as indium gallium nitride and aluminum gallium nitride. The junction portion 211 is a part of the light-emitting epitaxy layer 21, and is bonded to the junction surface 11. The intermediate layer 22 may be a binding layer or a combination of a binding layer with a reflecting layer and a stress releasing layer.

Figure 3C:
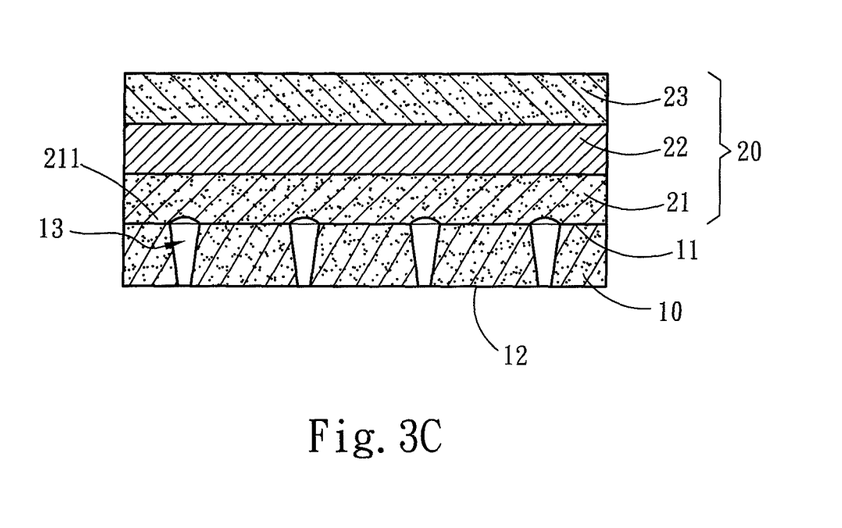

Referring to FIG. 3C, in Step S4, the bottom surface 12 is polished by chemical mechanical polishing such that the bottom surface 12 gradually moves towards the junction surface 11 to communicate with the holes 13. It should be noted that, since the purpose of polishing the bottom surface 12 is to make the bottom surface communicate 12 with the holes 13 thus, the height of the holes 13 can be controlled to accord with the polishing accuracy of the chemical mechanical polishing process in order to maintain simple operations without over demanding polishing accuracy.

Figure 3D:
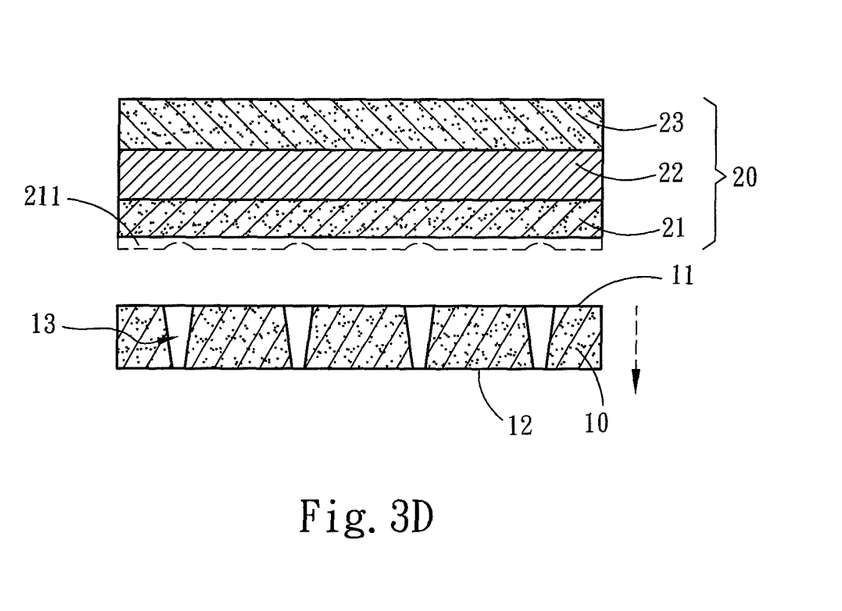

Referring to FIG. 3D, in Step S5, an etching liquid is guided to the junction portion 211 through the holes 13 to perform an etching process to separate the LED structure 20 from the substrate 10. In this embodiment, the etching liquid is a gallium nitride etching liquid such as potassium hydroxide or sodium hydroxide. The etching liquid seeps into the LED structure 20 via the holes 13 to etch the junction portion 211. After the junction portion 211 is etched, the LED structure 20 is separated from the substrate 10.

Figure 4:
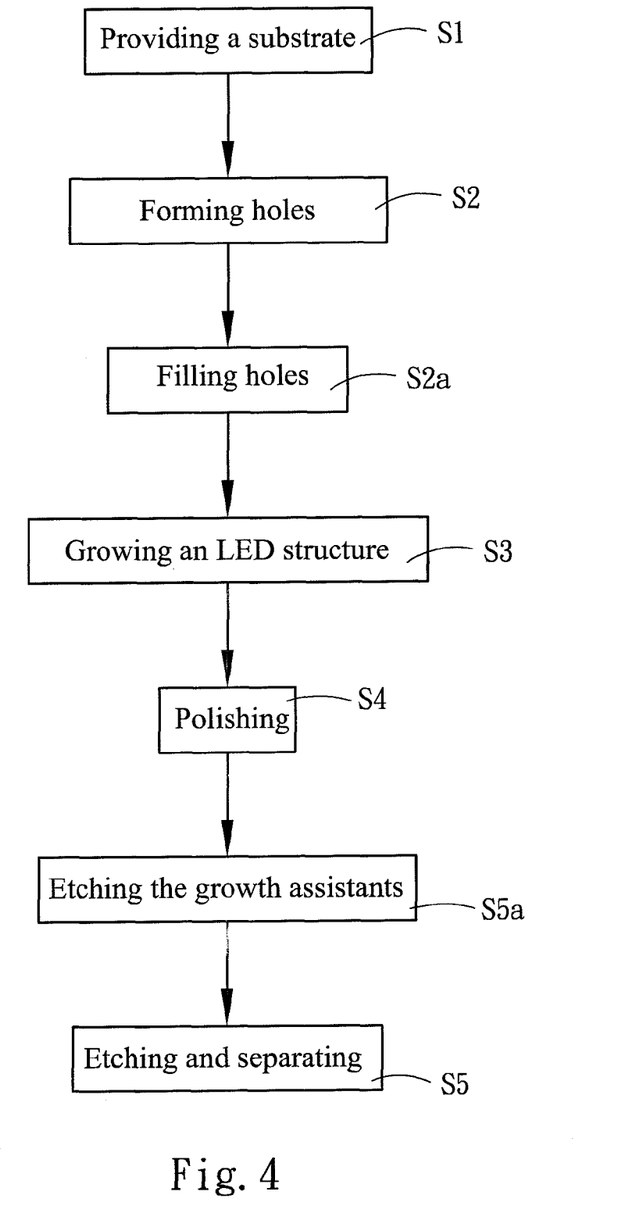
FIG. 4 is a flowchart showing the steps of a method for separating an LED structure from a substrate according to a second embodiment of the present invention.
Figure 5A:
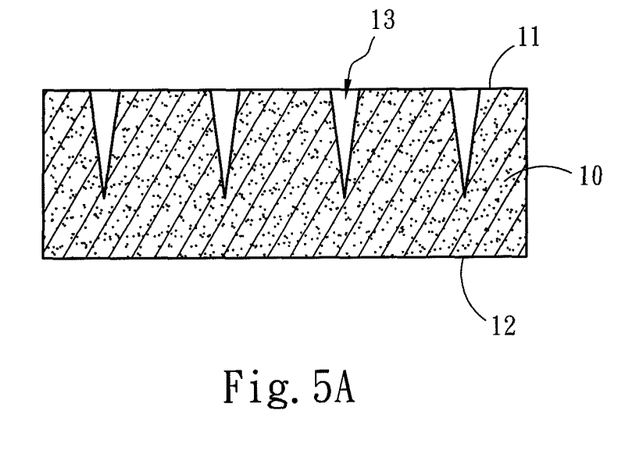
FIGS. 5A to 5F are schematic diagrams of the manufacturing processes of a method for separating an LED structure from a growth substrate according to the second embodiment of the present invention.
Figure 5B:
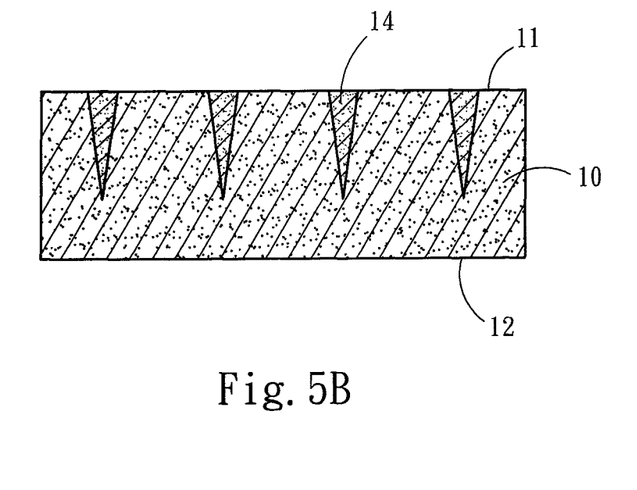
Figure 5C:
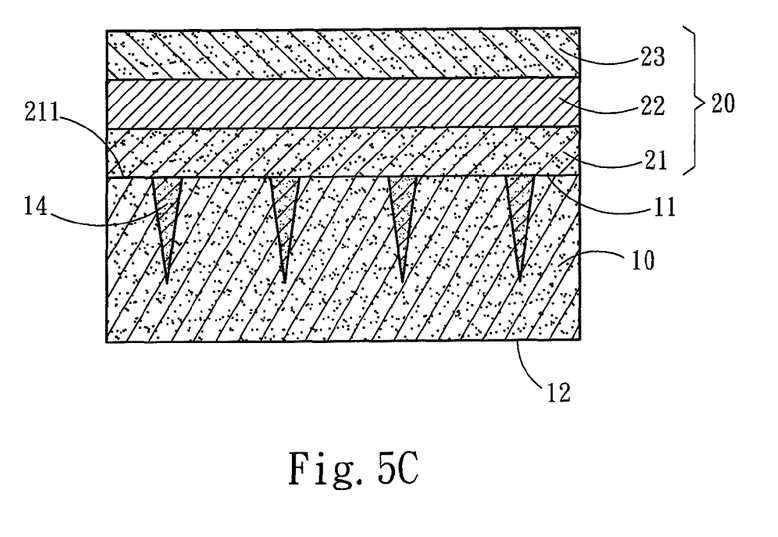
Figure 5D:
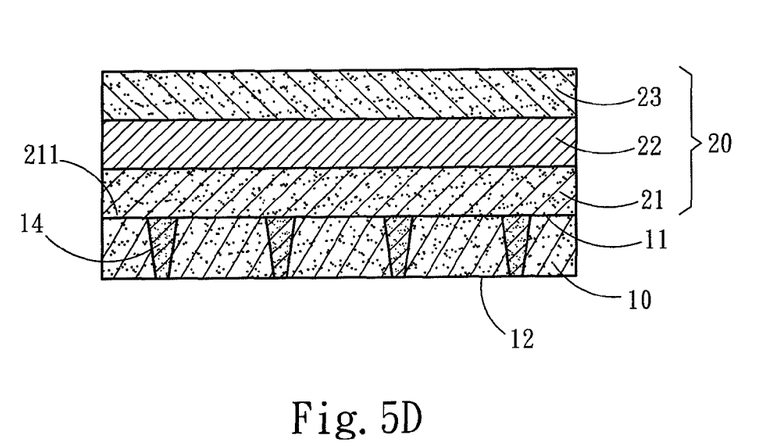
Figure 5E:
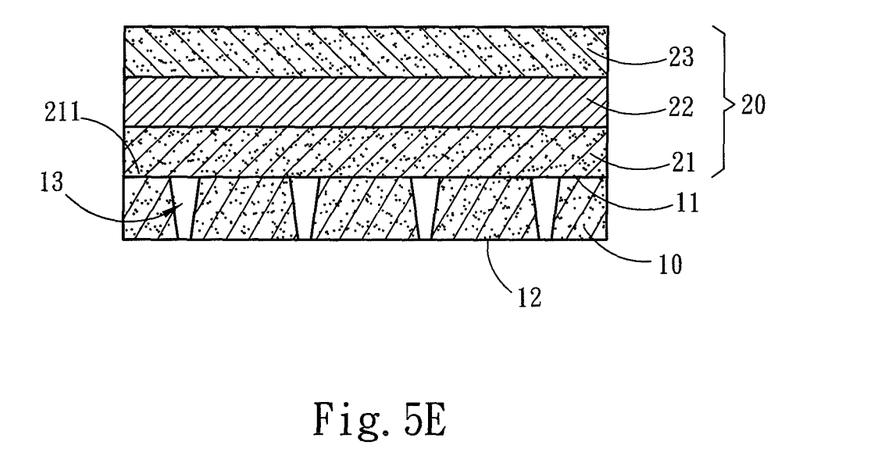
Figure 5F:
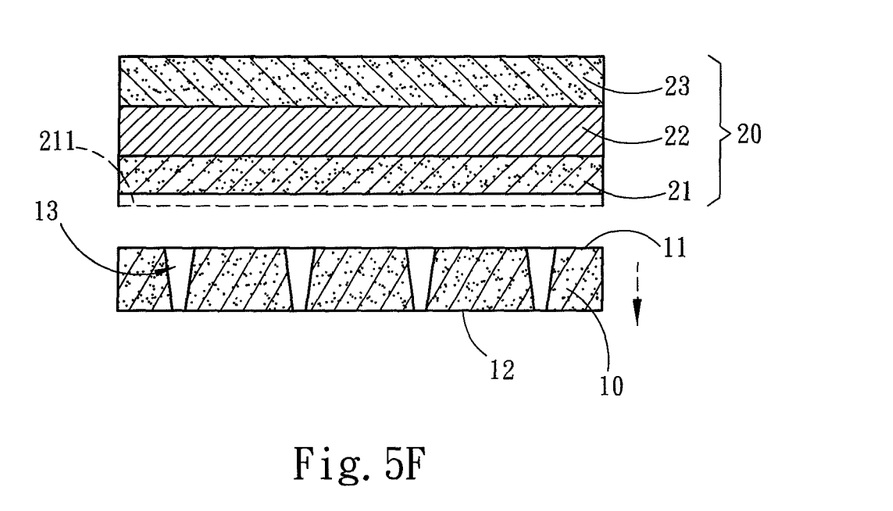
Figure 6A:
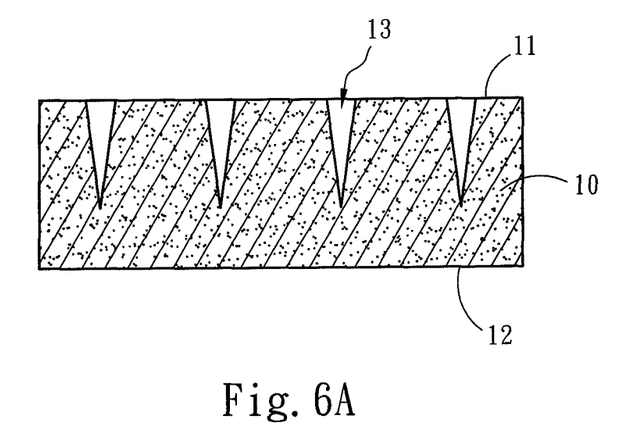
FIGS. 6A to 6F are schematic diagrams of the manufacturing processes according to a third embodiment of the present invention.
Figure 6B:
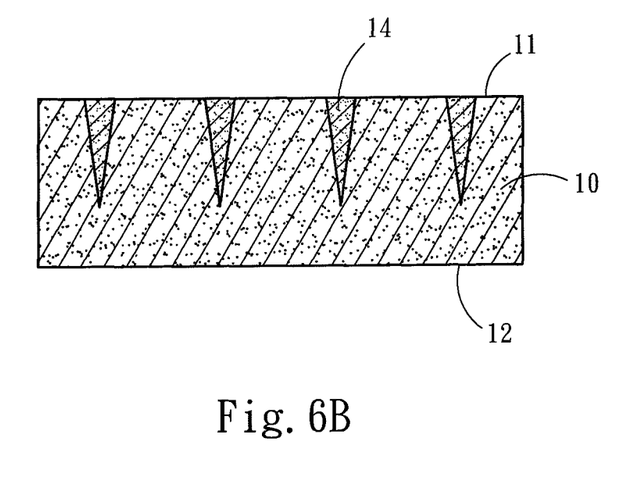
Figure 6C:
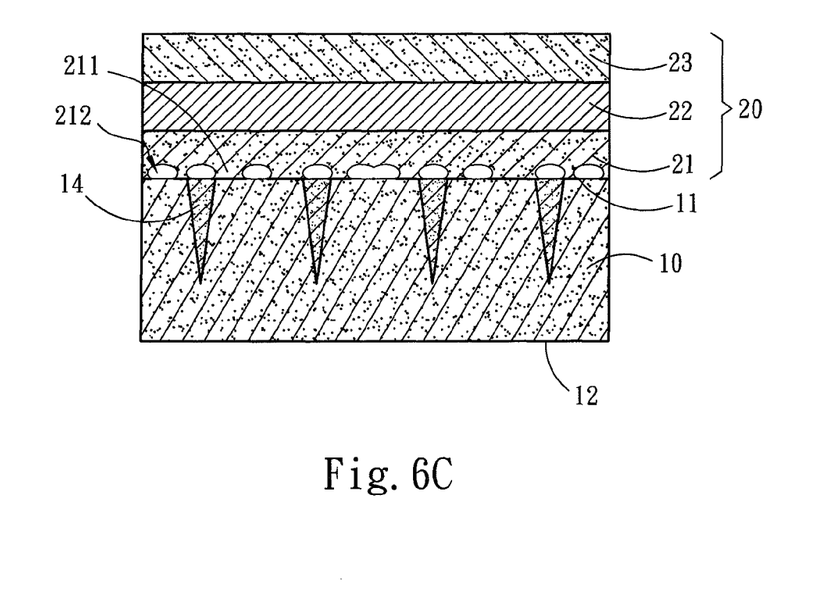
Figure 6D:
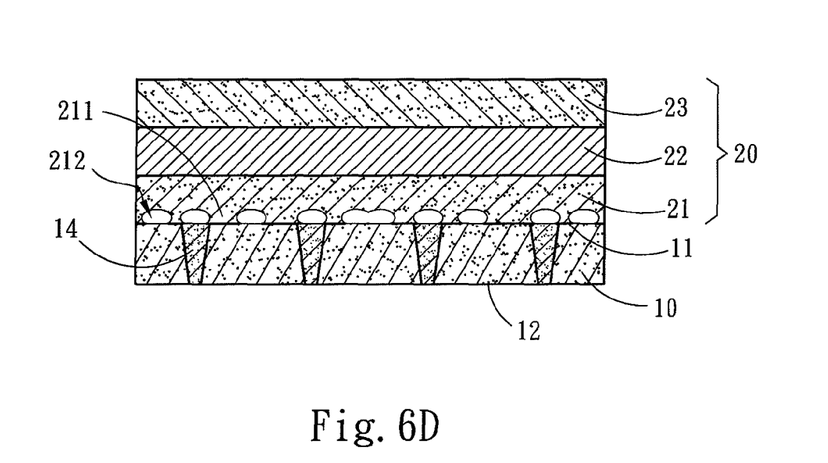
Figure 6E:
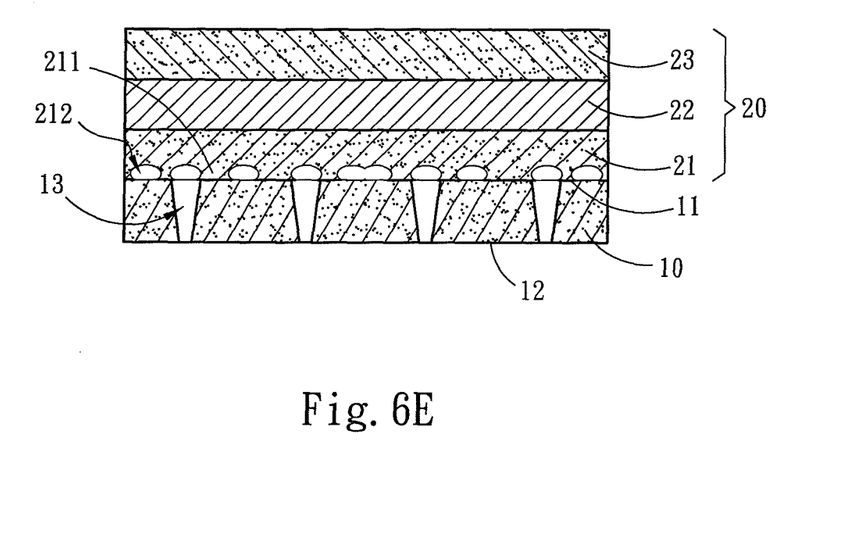
Figure 6F:
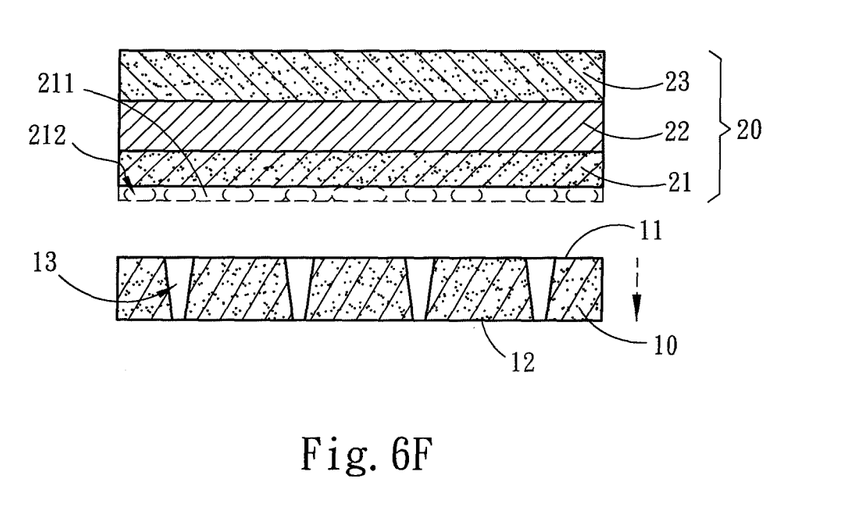

Please refer to FIG. 4 for a flowchart showing the steps of a method for separating an LED structure from a growth substrate according to a second embodiment of the present invention and to FIGS. 5A to 5F for schematic diagrams of the manufacturing processes of a method for separating an LED structure from a growth substrate according to the second embodiment. Compared with the first embodiment, the second embodiment further includes a Step S2a after Step S2. In Step S2a, the holes 13 are filled with growth assistants 14. In this embodiment the growth assistants 14 are silicon dioxide for example; however, this is not the limitation as the growth assistants 14 can also be selected from amorphous aluminum oxide, silicon nitride and aluminum nitride. A main purpose of Step S2a is to provide the junction surface 11 with preferred evenness when growing the LED structure 20 thereon since the holes 13 at the junction surface 11 are filled by the growth assistants 14. Hence, the quality of the light-emitting epitaxy layer 21 of the LED structure 20 is increased to give higher light-emitting efficiency. Furthermore, since the holes 13 are filled by the growth assistants 14 in Step S2a, a Step S5a is needed before Step S5. In Step S5a, the growth assistants 14 in the holes 13 are etched by an auxiliary etching liquid. The auxiliary etching liquid is applied to etch the growth assistants 14 in the holes 13 such that the holes 13 can communicate with the LED structure 20. Taking silicon dioxide as the growth assistants 14 for example, the auxiliary etching liquid may be a hydrofluoric acid solution. Accordingly, in Step S5, the junction portion 211 can be etched by the etching liquid.

Please refer to FIGS. 6A to 6F for schematic diagrams of the manufacturing processes according to a third embodiment of the present invention. Compared with the second embodiment, in Step S3 of the third embodiment, a plurality of pores 212 are formed in the junction portion 211 at the time the junction portion 211 is formed. More specifically, when growing the LED structure 20, the light-emitting epitaxy layer 21 is grown by metal organic chemical vapor deposition (MOCVD). By modulating manufacturing parameters such as changing the temperature, pressure and doping concentration, the junction portion 211 with the pores 212 is first formed on the junction surface 11, and then a light-emitting body of the light-emitting epitaxy layer 21 is formed on the junction portion 211. It should be noted that, a main purpose of forming the pores 212 is to increase a contact area between the etching liquid and the junction portion 211 when the junction portion 211 is etched in Step S5 thus to also increase the etching speed of the etching liquid so that the LED structure 20 can be more easily separated from the substrate 10.

In the method of the present invention, by forming the holes and polishing the bottom surface to communicate with the holes, the junction portion can be etched by the etching liquid through the holes to separate the LED structure from the substrate. Therefore it is easy to control the polishing process to provide a high yield rate as well as reduced production costs. Moreover, the growth assistants are filled into the holes in advance to further enhance the epitaxy quality of the LED structure. Furthermore, the pores are formed in the junction portion by modulating the manufacturing parameters to assist the LED structure to separate from the substrate.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for separating a light-emitting diode (LED) from a substrate, comprising the steps of:
   S1) providing a substrate, the substrate comprising a junction surface and a bottom surface far away from the junction surface;
   S2) forming a plurality of holes on the junction surface, wherein the plurality of holes are formed at a depth smaller than a thickness of the substrate;
   S3) growing an LED structure on the junction surface, the LED structure including a junction portion bonded to the junction surface;
   S4) polishing the bottom surface of the substrate after step S3 to expose the plurality of holes on the bottom surface; and
   S5) etching the junction portion by an etching liquid through the plurality of holes to separate the LED structure from the substrate.

2. The method of claim 1, after step S2, further comprising a step of:
   S2a) filling the plurality of holes with growth assistants; and before step S5, further comprising a step of:
   S5a) etching the growth assistants in the plurality of holes by an auxiliary etching liquid.

3. The method of claim 2, wherein the growth assistants are made of a material selected from a group consisting of silicon dioxide, amorphous aluminum oxide, silicon nitride and aluminum nitride.

4. The method of claim 2, wherein step S3 further comprise a step of: forming a plurality of pores in the junction portion at the same time that the junction portion is formed.

5. The method of claim 4, wherein the plurality of pores are formed by metal organic chemical vapor deposition.

6. The method of claim 1, wherein the substrate is a sapphire substrate.

7. The method of claim 1, wherein the LED structure comprises a light-emitting epitaxy layer which is made of a material selected from the group consisting of gallium nitride, indium gallium nitride and aluminum gallium nitride.

8. The method of claim 1, wherein the plurality of holes are formed at a height between 10 and 50 μm and a width between 2 and 6 μm.

* * * * *